(12) United States Patent
Kwag et al.

(10) Patent No.: US 11,063,174 B2
(45) Date of Patent: Jul. 13, 2021

(54) LIGHT EMITTING DIODE AND MANUFACTURING METHOD OF LIGHT EMITTING DIODE

(71) Applicant: SAMSUNG ELECTRONICS CO., LTD., Suwon-si (KR)

(72) Inventors: Doyoung Kwag, Suwon-si (KR); Masaru Wada, Suwon-si (KR); Jamyeong Koo, Suwon-si (KR); Eunhye Kim, Suwon-si (KR); Sangmoo Park, Suwon-si (KR); Seona Yang, Seoul (KR); Minsub Oh, Suwon-si (KR); Yoonsuk Lee, Suwon-si (KR); Youngkyong Jo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/653,449

(22) Filed: Oct. 15, 2019

(65) Prior Publication Data

US 2020/0119223 A1    Apr. 16, 2020

(30) Foreign Application Priority Data

Oct. 15, 2018    (KR) .......................... 10-2018-0122523

(51) Int. Cl.
*H01L 33/00* (2010.01)
*H01L 33/38* (2010.01)
(Continued)

(52) U.S. Cl.
CPC ........ *H01L 33/0093* (2020.05); *H01L 33/382* (2013.01); *H01L 33/46* (2013.01);
(Continued)

(58) Field of Classification Search
CPC ... H01L 33/0093; H01L 33/48; H01L 33/382; H01L 33/46; H01L 2933/0016;
(Continued)

(56) References Cited

U.S. PATENT DOCUMENTS 6,458,612 B1    10/2002    Chen et al.
6,939,729 B2    9/2005    Iwafuchi et al.
(Continued)

FOREIGN PATENT DOCUMENTS

CN    105914275 B    4/2018
JP    2002-134785 A    5/2002
(Continued)

OTHER PUBLICATIONS

International Search Report (PCT/ISA/210) dated Jan. 28, 2020 issued by the International Searching Authority in International Application No. PCT/KR2019/013472.
(Continued)

*Primary Examiner* — Nikolay K Yushin
(74) *Attorney, Agent, or Firm* — Sughrue Mion, PLLC (57) ABSTRACT

A light emitting diode (LED) includes: a device substrate; a first semiconductor layer above the device substrate, and doped with an n-type dopant; a second semiconductor layer above the first semiconductor layer, and doped with a p-type dopant; an active layer between the first semiconductor layer and the second semiconductor layer and configured to provide light; a transparent electrode layer adjacent to an upper part of the second semiconductor layer; and a first electrode pad and a second electrode pad between the device substrate and the first semiconductor layer, the first electrode pad electronically connected with the first semiconductor layer and the second electrode pad electrically connected with the second semiconductor layer, wherein light provided
(Continued)

by the active layer is irradiated to an outside in a direction from the active layer to the second semiconductor layer.

18 Claims, 10 Drawing Sheets

(51) Int. Cl.
    *H01L 33/48* (2010.01)
    *H01L 33/46* (2010.01)
(52) U.S. Cl.
    CPC ...... *H01L 33/48* (2013.01); *H01L 2933/0016* (2013.01); *H01L 2933/0025* (2013.01)
(58) Field of Classification Search
    CPC ....... H01L 2933/002; H01L 2933/0091; H01L 2933/0066
    See application file for complete search history.

(56) References Cited

U.S. PATENT DOCUMENTS

| | | | |
|---|---|---|---|
| 6,969,624 B2 | 11/2005 | Iwafuchi et al. | |
| 8,361,268 B2 | 1/2013 | Mizuno et al. | |
| 8,633,087 B2 | 1/2014 | Matsubara et al. | |
| 8,646,505 B2 | 2/2014 | Bibl et al. | |
| 8,969,897 B2 | 3/2015 | Choi | |
| 9,024,340 B2* | 5/2015 | Minato | H01L 33/58 257/98 |
| 9,941,259 B2* | 4/2018 | Yoo | H01L 25/075 |
| 2010/0320479 A1* | 12/2010 | Minato | H01L 33/507 257/88 |
| 2011/0261847 A1 | 10/2011 | Chou | |
| 2012/0305959 A1* | 12/2012 | Yu | H01L 33/08 257/98 |
| 2013/0113007 A1 | 5/2013 | Choi | |
| 2013/0137220 A1 | 5/2013 | Matsubara et al. | |
| 2018/0068986 A1* | 3/2018 | Yoo | H05K 999/99 |
| 2019/0140208 A1 | 5/2019 | Yang et al. | |

FOREIGN PATENT DOCUMENTS

| | | |
|---|---|---|
| JP | 2012-230969 A | 11/2012 |
| KR | 10-2011-0035489 A | 4/2011 |
| KR | 10-2013-0050060 A | 5/2013 |
| KR | 10-1733225 B1 | 5/2017 |
| KR | 10-1745263 B1 | 6/2017 |
| KR | 10-1799656 B1 | 11/2017 |

OTHER PUBLICATIONS

Written Opinion (PCT/ISA/237) dated Jan. 28, 2020 issued by the International Searching Authority in International Application No. PCT/KR2019/013472.

\* cited by examiner

LIGHT EMITTING DIODE AND MANUFACTURING METHOD OF LIGHT EMITTING DIODE

CROSS-REFERENCE TO RELATED APPLICATION(S)

This application is based on and claims priority under 35 U.S.C. § 119 to Korean Patent Application No. 10-2018-0122523, filed on Oct. 15, 2018, in the Korean Intellectual Property Office, the disclosure of which is incorporated by reference herein in its entirety.

BACKGROUND

1. Field

The disclosure relates to a light emitting diode (LED) and a manufacturing method of an LED, and more particularly, to an LED that is minimized as it is formed in a flip chip type, and a manufacturing method of an LED with an improved manufacturing efficiency.

2. Description of Related Art

Semiconductor light emitting diodes (LEDs) are being used widely not only as light sources for lighting apparatuses, but also as light sources for various types of display apparatuses of diverse electronic products such as televisions (TVs), mobile phones, mobile devices, tablet devices, personal computers (PCs), laptop PCs, and personal digital assistants (PDAs).

Micro LEDs of which sizes are equal to or smaller than 100 µm are being developed with fast reaction speed, low power consumption, and high brightness compared to related art LEDs, and are therefore gaining popularity as LEDs for next-generation displays.

In the case of flip chip type LEDs among micro LEDs, these LEDs have a structure that is advantageous for miniaturization, reducing weight, and improving integration of a single diode, while also improving light emitting efficiency and efficiency of a transfer process, etc., in manufacturing a display apparatus. Thus, such flip chip type LEDs are being applied to the field of micro LEDs.

However, in a process of manufacturing flip chip type LEDs, several heat processing steps are performed. Accordingly, a warpage phenomenon, or a phenomenon that causes pitches among LEDs to be deformed may occur due to the difference of thermal expansion coefficients.

SUMMARY

Provided are a flip chip type light emitting diode (LED) that improves utilization of an LED and efficiency of a manufacturing process, and a manufacturing method of an LED that enables easy manufacture of an LED.

Additional aspects will be set forth in part in the description which follows and, in part, will be apparent from the description, or may be learned by practice of the presented embodiments.

In accordance with an aspect of the disclosure, a light emitting diode (LED) includes: a device substrate; a first semiconductor layer above the device substrate, and doped with an n-type dopant; a second semiconductor layer above the first semiconductor layer, and doped with a p-type dopant; an active layer between the first semiconductor layer and the second semiconductor layer and configured to provide light; a transparent electrode layer adjacent to an upper part of the second semiconductor layer; and a first electrode pad and a second electrode pad between the device substrate and the first semiconductor layer, the first electrode pad electronically connected with the first semiconductor layer and the second electrode pad electrically connected with the second semiconductor layer, wherein light provided by the active layer is irradiated to an outside in a direction from the active layer to the second semiconductor layer.

The n-type dopant may be at least one of Si, Ge, Se, Te, and C; and the p-type dopant may be at least one of Mg, Zn, Be, Ca, Sr, and Ba.

The LED may further include: a reflective layer below the first semiconductor layer, and wherein the reflective layer reflects light provided by the active layer in the direction from the active layer to the second semiconductor layer.

In accordance with another aspect of the disclosure, a light emitting diode (LED) structure includes: a support substrate; a second semiconductor layer above the support substrate, and doped with a p-type dopant; a first semiconductor layer above the second semiconductor layer, and doped with an n-type dopant; an active layer between the first semiconductor layer and the second semiconductor layer and configured to provide light; a first electrode pad and a second electrode pad above the first semiconductor layer, the first electrode pad electronically connected with the first semiconductor layer and the second electrode pad electrically connected with the second semiconductor layer; a transparent electrode layer below the second semiconductor layer; and a separation layer between the support substrate and the transparent electrode layer.

The support substrate may be a gallium arsenide substrate, a sapphire substrate, a silicon substrate, or a plastic substrate.

The transparent electrode layer and the separation layer may be arranged to correspond to the second semiconductor layer such that a portion of the support substrate is exposed.

In accordance with another aspect of the disclosure, a manufacturing method of an LED, includes: forming, on a growth substrate, an epitaxial structure including a first semiconductor layer, an active layer, and a second semiconductor layer; attaching a support substrate to the epitaxial structure; separating the growth substrate from the epitaxial structure to which the support substrate is attached; forming a first electrode and a second electrode on the epitaxial structure from which the growth substrate was separated; forming a first electrode pad electrically connected with the first electrode and forming a second electrode pad electrically connected with the second electrode; and removing a predetermined area of the epitaxial structure.

The manufacturing method may further include: prior to the attaching the support substrate, forming a separation layer and a transparent electrode layer on the support substrate, wherein the attaching the support substrate may include attaching the support substrate such that the separation layer and the transparent electrode layer are between the support substrate and the epitaxial structure.

The forming the separation layer and the transparent electrode layer may include: removing predetermined areas of the separation layer and the transparent electrode layer.

The transparent electrode layer, the separation layer, and the support substrate may be sequentially arranged on the second semiconductor layer.

The first electrode pad and the second electrode pad may be formed below the first semiconductor layer.

The separating the growth substrate may include: separating the growth substrate by a laser lift off method or a chemical lift off method.

The manufacturing method may further include: after the removing the predetermined area, separating the LED from the support substrate.

The growth substrate may be a gallium arsenide substrate or a sapphire substrate.

The manufacturing method may further include: mounting the separated LED on a device substrate.

The forming the epitaxial structure may include: forming the epitaxial structure above a buffer layer on the growth substrate.

Prior to the attaching, the separation layer and the transparent electrode layer may be on a first surface of the support substrate only in areas corresponding to LEDs, such that predetermined areas of the first surface are exposed.

The areas of the first surface on which the separation layer and the transparent electrode layer are provided may be smaller in size than the LEDs.

The manufacturing method may further include: after removing the predetermined area of the epitaxial structure, separating the LED from the support substrate by irradiating a laser beam on the separation layer between the support substrate and the second semiconductor layer to remove the separation layer.

A manufacturing method of an LED, including: forming, on a growth substrate, an epitaxial structure including a first semiconductor layer, an active layer, and a second semiconductor layer; attaching a support substrate to the epitaxial structure; separating the growth substrate from the epitaxial structure to which the support substrate is attached; forming at least one electrode on the epitaxial structure from which the growth substrate was separated; and separating the LED, including the epitaxial structure and the at least one electrode, from the support substrate.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Hereinafter, embodiments of an LED and a manufacturing method of an LED will be described in detail with reference to the accompanying drawings.

The embodiments that will be described below are exemplary embodiments for promoting understanding of the disclosure, and it should be understood that the disclosure may be implemented while being modified in various forms. Meanwhile, in explaining embodiments, where a detailed explanation of related known functions or features may unnecessarily confuse the gist of the disclosure, the detailed explanation and detailed illustration thereof may be omitted. Also, in the accompanying drawings, some components may not be illustrated in their actual scales, but may be illustrated in more enlarged sizes than their actual sizes, for promoting understanding of the disclosure.

Meanwhile, terms such as "first," "second," and the like may be used to describe various components, but the components are not intended to be limited by the terms. The terms are used to distinguish one component from another component. For example, a first component may be called a second component, and a second component may be called a first component in a similar manner, without departing from the scope of the disclosure.

Also, the terms used in the description of embodiments may be interpreted with meanings generally known to those of ordinary skill in the art described in the disclosure, unless defined differently in the disclosure.

In addition, the terms "front end," "rear end," "upper part," "lower part," "upper end," "lower end," etc., used in the disclosure are defined based on the drawings, and the form and the location of each component are not to be limited by the terms.

It is understood that, hereinafter, expressions such as "at least one of," when preceding a list of elements (e.g., "at least one of A and B" or "at least one of A or B"), modify the entire list of elements (i.e., only A, only B, or both A and B) and do not modify the individual elements of the list.

Hereinafter, embodiments will be described in detail with reference to the accompanying drawings.

Figure 1:
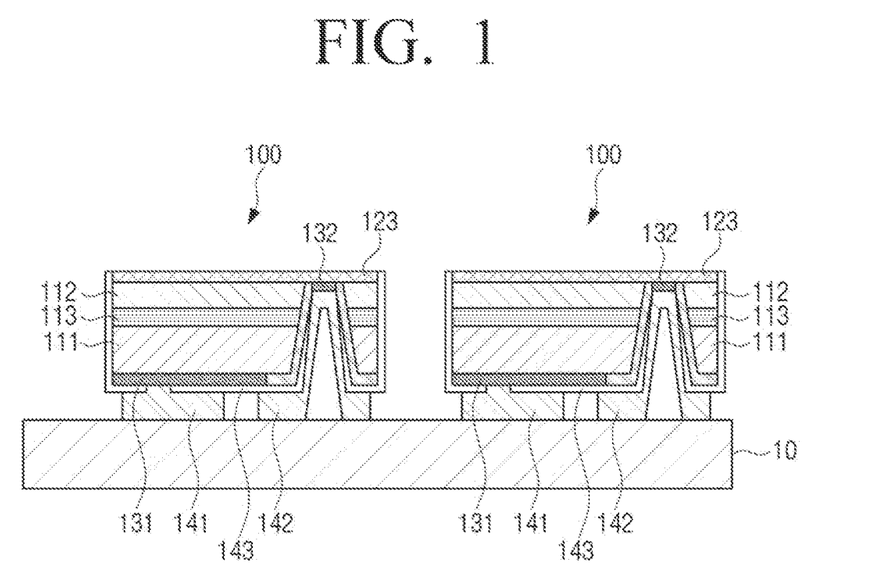
FIG. 1 is a cross-sectional view of LEDs mounted on a device substrate according to an embodiment.

FIG. 1 is a cross-sectional view of LEDs 100 mounted on a device substrate 10 according to an embodiment.

Referring to FIG. 1, each LED 100 is provided on a device substrate 10 in a state of being separated from one another. The LEDs 100 may each include electrode pads 141, 142, a first semiconductor layer 111, an active layer 113, a second semiconductor layer 112, and a transparent electrode layer 123 sequentially from the device substrate 10.

Also, the LEDs 100 may irradiate lights in specific colors, for example, in red (R), green (G), and blue (B), to form an image.

Any material may be used for the device substrate 10 if it is a material that can be used for displays or lighting. In particular, the device substrate 10 may include a transistor, or an integrated circuit or metal wiring by a separate laminated structure. Also, the device substrate 10 may be a substrate in which a plurality of separate substrates are combined or joined.

Materials that constitute the device substrate 10 may include ceramic materials such as gallium nitride, glass, sapphire, quarts, and silicon carbide, or organic materials or flexible materials such as polyethylene terephthalate, polyethylene naphthalate, polycarbonate, polyethersulfone, polycyclicolefin, and polyimide. Also, the device substrate 10 may have electronic thermal conductivity or an electronic thermal insulating property depending on usage examples.

The LED 100 may be connected to the device substrate 10 through the electrode pads 141, 142. Also, the LED 100 may be arranged on the device substrate 10 and constitute a light emitting module of the display.

The device substrate 10 may include an electrode pad connected to the electrode pads 141, 142 of the LED 100. The electrode pads 141, 142 may be provided as patterned metal patterns.

Also, the electrode pads 141, 142 may include a first electrode pad 141 and a second electrode pad 142 forming a flip chip structure.

The first electrode pad 141 may be electronically connected with the first semiconductor layer 111 that will be described below, and the second electrode pad 142 may be electronically connected with the second semiconductor layer 112 that will be described below. The first electrode pad 141 and the second electrode pad 142 may be arranged below the first semiconductor layer 111, and the first electrode pad 141 and the second electrode pad 142 may be arranged on the same plane.

The first electrode pad 141 may be formed on the bottom of the first semiconductor layer 111 as a conductive material is connected to a first electrode 131 formed on the second semiconductor layer 112.

The second electrode pad 142 may be formed on the bottom of the first semiconductor layer 111 as a conductive material is connected to a second electrode 132 formed on the first semiconductor layer 111.

The LED 100 may be formed in a flip chip type as the first electrode pad 141 and the second electrode pad=142 are formed on the same plane of the bottom of the first semiconductor layer 111.

Such an LED 100 in a flip chip type is advantageous for miniaturization, reducing weight, and increasing integration of a diode. Also, in manufacturing a display apparatus, because of the structure of the LED 100, an electrode does not limit a light emitting area and light emitting efficiency can therefore be improved. In addition, in combination with the device substrate 10, an intermediate medium like a wire is not used, and thus efficiency of a transfer process, etc., can be improved.

The LED 100 may be connected with the device substrate 10 in an epitaxial structure 110 (FIG. 3) through the electrode pads 141, 142. The LED 100 may include the first semiconductor layer 111, the active layer 113, the second semiconductor layer 112, and the transparent electrode layer 123 sequentially laminated on the epitaxial structure 110.

Specifically, the first semiconductor layer 111 may be formed on the electrode pads 141, 142. The composition and the material of the first semiconductor layer 111 may vary according to the composition and the material of the active layer 113 formed in its upper part.

Also, the first semiconductor layer 111 may be of an n-type conductive type. In addition, the first semiconductor layer 111 may be formed as a layer on which an n-type dopant (for example, Si, Ge, Sn, Se, Te, etc.) is doped.

The second semiconductor layer 112 may be formed on the first semiconductor layer 111. The second semiconductor layer 112 includes the same base material as the first semiconductor layer 111 but a different dopant. Further, the second semiconductor layer 112 is of a conductive type complementary with the first semiconductor layer 111.

Accordingly, the second semiconductor layer 112 may be of a p-type conductive type. Also, the second semiconductor layer 112 may be formed as a layer on which a p-type dopant (for example, Zn, Mg, Co, Ni, Cu, Fe, C, etc.) is doped.

The first semiconductor layer 111 is a layer providing electrons, and the second semiconductor layer 112 may be a layer providing holes.

The active layer 113 may be formed between the first semiconductor layer 111 and the second semiconductor layer 112. The first semiconductor layer 111, the active layer 113, and the second semiconductor layer 112 may be sequentially formed in a vertical direction.

The active layer 113 is a layer wherein electrons provided from the first semiconductor layer 111 and holes provided from the second semiconductor layer 112 are recombined and output light of a specific wavelength, and a well layer and a barrier layer are alternatingly laminated. Thus, the active layer 113 may have a single quantum well structure or a multi-quantum well (MQW) structure.

The transparent electrode layer 123 may be arranged on the second semiconductor layer 112. Also, the transparent electrode layer 123 may include ITO, which is a conductive and transparent material. In case the transparent electrode layer 123 is constituted as a conductive and transparent material, the transparent electrode layer 123 may perform the function of diffusing currents.

Also, the LED 100 may further include a reflective layer 143 formed under the first semiconductor layer 111. The reflective layer 143 may reflect light provided from the active layer 113 in the direction of the second semiconductor layer 112.

The reflective layer 143 may include metal having high reflectivity so as to reflect light. For example, the reflective layer 143 may include metal such as aluminum (Al), silver (Ag), and nickel (Ni).

In the case of the LED 100 that is flip chip bonded in a structure as described above, if power is applied to the LED 100 through the device substrate 10, electrons and holes are combined on the active layer 113 and light is provided.

Some portions of the light provided from the active layer 113 are irradiated to the outside through the second semiconductor layer 112, and the remaining portions of the light are reflected on the reflective layer 143 formed under the first semiconductor layer 111, and are then irradiated to the outside through the second semiconductor layer 112.

As the LED 100 is a flip-chip structure, light provided from the active layer 113 is irradiated to the outside directly, or through the second semiconductor layer 112 after being reflected, and therefore light efficiency may increase.

Also, as the first electrode pad 141 and the second electrode pad 142 contacting the device substrate 10 are formed on the lower surface of the first semiconductor layer 111 of the LED 100, a problem that light efficiency is reduced due to an area bonded by an intermediate medium such as a wire can be prevented.

The LED 100 according to an embodiment is manufactured by replacing a substrate under a high temperature and high pressure minimally through a method that will be described in detail below. Accordingly, a light emitting surface from which light is irradiated to the outside includes the second semiconductor layer 112. Also, the LED 100 mounted on the device substrate 10 may be formed such that the first semiconductor layer 111, the active layer 113, and the second semiconductor layer 112 are sequentially laminated on the device substrate 10, as the growing order of the epitaxial structure 110 (refer to FIG. 3).

Hereinafter, a manufacturing method of an LED 100 according to an embodiment will be described.

Figure 2:
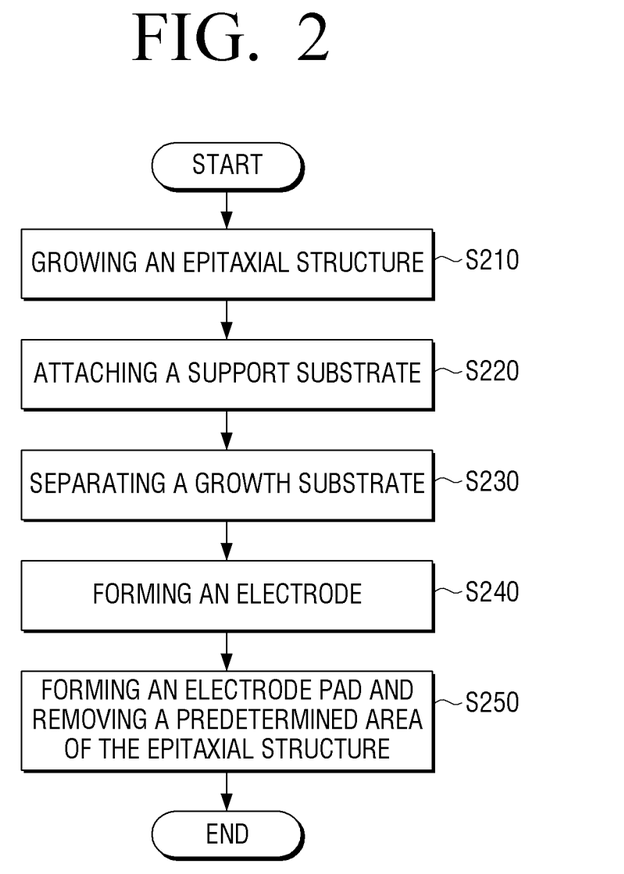
FIG. 2 is a flowchart illustrating a manufacturing method of an LED according to an embodiment.

FIG. 2 is a flowchart illustrating a manufacturing method of an LED according to an embodiment.

Referring to FIG. 2, the manufacturing method of an LED 100 according to an embodiment may include an operation S210 of growing an epitaxial structure 110 on a growth substrate 101 (see FIG. 3), an operation S220 of attaching a support substrate 121 to the epitaxial structure 110, an operation S230 of separating the growth substrate 101, an operation S240 of forming an electrode on the epitaxial structure 110, and an operation S250 of forming an electrode pad and forming an LED 100 separated through isolation. Also, after the isolation operation S250, an operation of separating the LED 100 from the support substrate 121 for mounting the LED 100 on the device substrate 10 may be further included. Hereinafter, each operation of a specific manufacturing method according to an embodiment will be described.

The operation S220 of attaching a support substrate to the epitaxial structure 110, and the operation S230 of separating the growth substrate 101 are operations of replacing substrates, and are performed under a high temperature and high pressure. In the manufacturing method of an LED 100 according to an embodiment, operations of replacing substrates that are performed under a high temperature and high pressure are minimized.

Accordingly, the problem that a warpage phenomenon and a phenomenon that pitches among LEDs 100 are deformed due to a high temperature and high pressure can be minimized.

Also, in the manufacturing method of an LED 100 according to an embodiment, after an operation of replacing a substrate is performed, an electrode and an electrode pad are formed on the epitaxial structure 110, and a separated LED 100 is formed through isolation. Accordingly, even if warpage is provided in the epitaxial structure 110 during an operation of replacing a substrate, warpage is not provided in the LED 100 formed after the operation of replacing a substrate, and pitches among the LEDs 100 can be maintained to be constant.

Also, as the LED 100 formed as described above is attached to the device substrate 10 without an additional process afterwards, the problem that constant pitches among the LEDs 100 are deformed can be prevented.

In addition, the manufacturing method of an LED 100 according to an embodiment is simple, and thus manufacturing of an LED 100 is easy according to an embodiment.

Figure 3:
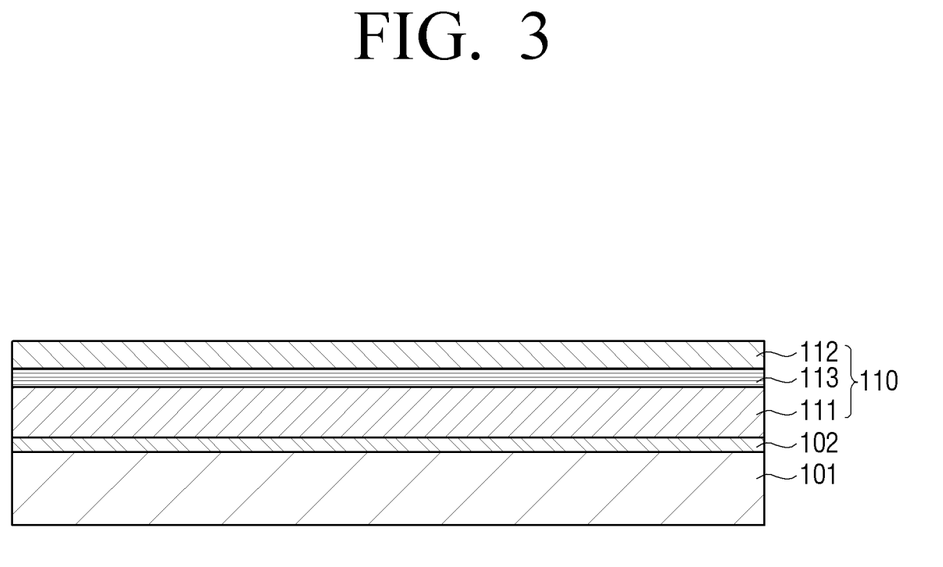
FIG. 3 is a cross-sectional view illustrating a growth process of an epitaxial structure of an LED according to an embodiment.

FIG. 3 is a cross-sectional view illustrating a growth process of an epitaxial structure 110 of an LED 100 according to an embodiment.

Referring to FIG. 3, an epitaxial structure 110 on which the first semiconductor layer 111, the active layer 113, and the second semiconductor layer 112 are sequentially laminated may be formed on the growth substrate 101.

The growth substrate 101 may include a sapphire ($Al_2O_3$), silicon carbide (SiC), gallium nitride (GaN), indium gallium nitride (InGaN), gallium and aluminum nitride (AlGaN), aluminum nitride (AlN), gallium oxide (Ga2O3), gallium arsenide (GaAs), or silicon substrate.

By way of example, the LED 100 for irradiating a red (R) light may be manufactured on the growth substrate 101 that is, for example, a gallium arsenide (GaAs) substrate, and the LED 100 for irradiating green (G) and blue (B) lights may be manufactured on the growth substrate 101 that is, for example, a sapphire ($Al_2O_3$) substrate.

The epitaxial structure 110 may include the first semiconductor layer 111, the active layer 113, and the second semiconductor layer 112 that are sequentially laminated from the growth substrate 101.

Meanwhile, a buffer layer 102 may be formed between the growth substrate 101 and the epitaxial structure 110.

The buffer layer 102 is a layer that may be selectively etched, and may reduce grid inconsistency between the growth substrate 101 and the epitaxial structure 110.

Figure 4:
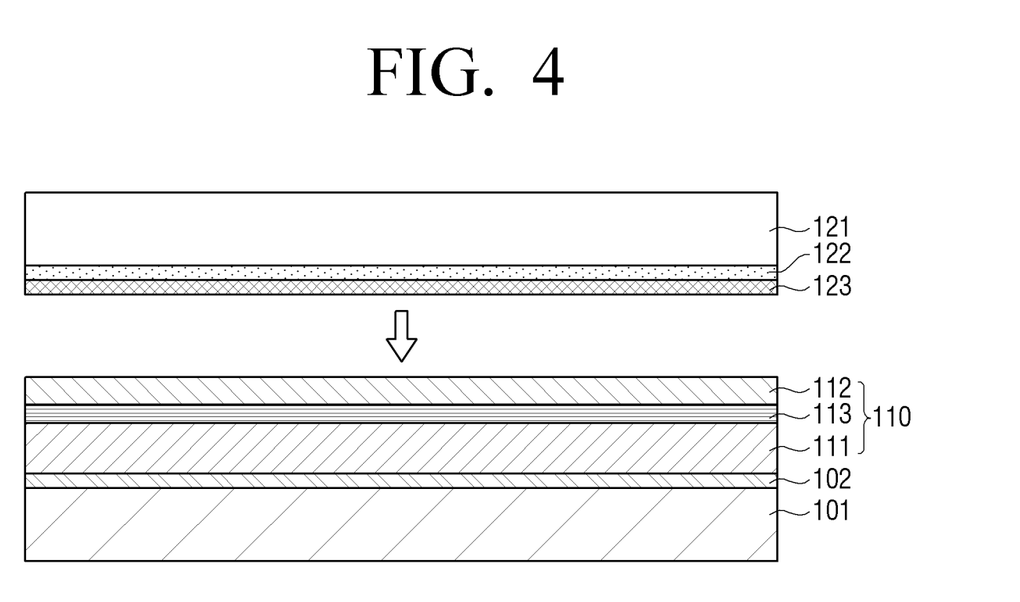
FIG. 4 is a cross-sectional view illustrating a process of attaching a support substrate of an LED according to an embodiment.

FIG. 4 is a cross-sectional view illustrating a process of attaching a support substrate 121 of an LED 100 according to an embodiment.

Referring to FIG. 4, the support substrate 121 performs the role of supporting the entire LED 100 as the growth substrate 101 of the epitaxial structure 110 is removed. The support substrate 121 may be attached to the top surface of the second semiconductor layer 112.

The support substrate 121 may use at least one substrate among a sapphire substrate, a silicon substrate, a plastic substrate, and a plastic film. Also, the support substrate 121 may be formed by attaching a substrate of a flexible material and then attaching a substrate of a rigid material. Excessive deformation and occurrence of cracks on the epitaxial structure 110 can be prevented by a substrate of a flexible material, and the epitaxial structure 110 can be supported robustly and handling can be easily performed in the manufacturing process by a substrate of a rigid material.

Figure 8:
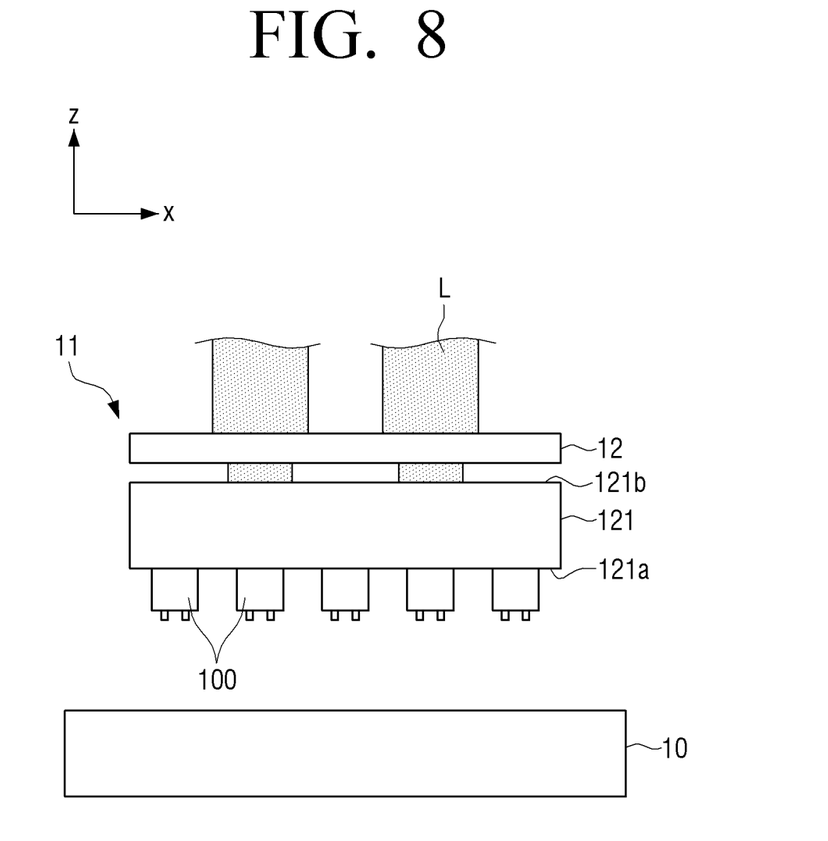
FIG. 8 is a cross-sectional view illustrating a process wherein an LED is separated from a support substrate according to an embodiment.

The support substrate 121 may include a first surface 121a attached to the epitaxial structure 110 and a second surface 121b opposite to the first surface 121a (see FIG. 8).

On the first surface 121a of the support substrate 121, a separation layer 122 and a transparent electrode layer 123 may be sequentially arranged. The separation layer 122 may be arranged to be adjacent (e.g., directly adjacent) to the first surface 121a.

When the LED 100 is separated from the support substrate 121 and is mounted on the device substrate 10, the separation layer 122 causes or facilitates easy separation of the LED 100 from the support substrate 121.

A laser beam may be irradiated through the second surface 121b of the support substrate 121, and the support substrate 121 may thereby be separated from the LED 100. Here, the separation layer 122 is removed by the laser beam, and the support substrate 121 may be separated.

The support substrate 121 may include a non-absorbent material with respect to a laser beam. The separation layer 122 may include a material that is removed as it evaporates by absorbing a laser beam. Also, the separation layer 122 may include a material that is easily removed by a laser beam and that has a high melting temperature and excellent flatness. For example, the separation layer 122 may include polyimide, etc., but is not limited thereto.

In addition, the support substrate 121 may perform the function of a carrier substrate supporting the LED 100 when the LED 100 is mounted on the device substrate 10 through a laser lift-off (LLO) method that will be described below.

The separation layer 122 may be applied on the support substrate 121 in the form of a film by a method such as coating a material in a liquid state, etc.

As the separation layer 122 that is easily removed by a laser beam is formed on the support substrate 121, the support substrate 121 can be easily separated. Also, the separation layer 122 can protect the LED 100 in a process in which the support substrate 121 is separated.

The transparent electrode layer 123 may be arranged under the separation layer 122. If the support substrate 121 is attached to the epitaxial structure 110, the transparent electrode layer 123 may be arranged on the surface in the upper part of the second semiconductor layer 112.

The support substrate 121 including the separation layer 122 and the transparent electrode layer 123 may be attached to the epitaxial structure 110. Accordingly, the epitaxial structure 110, the transparent electrode layer 123, the separation layer 122, and the support substrate 121 are sequentially laminated from the growth substrate 101.

Figure 5:
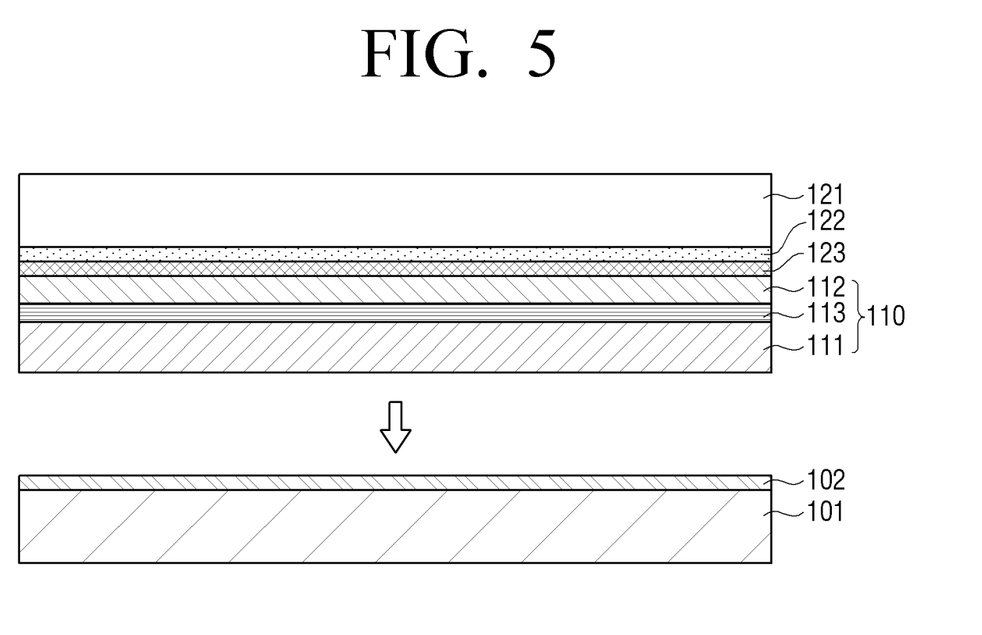
FIG. 5 is a cross-sectional view illustrating a process of separating a growth substrate of an LED according to an embodiment.

FIG. 5 is a cross-sectional view illustrating a process of separating a growth substrate 101 of an LED 100 according to an embodiment.

Referring to FIG. 5, the growth substrate 101 may be separated from the epitaxial structure 110. As the growth substrate 101 absorbs a light emitting spectrum, separating the growth substrate 101 may improve light extraction efficiency.

While the growth substrate 101 is being removed, the epitaxial structure 110 may be fixed to the support substrate 121.

In case the growth substrate 101 according to an embodiment includes gallium arsenide (GaAS), the growth substrate 101 may be separated from the epitaxial structure 110 through chemical lift-off (CLO).

Meanwhile, in case the growth substrate 101 according to another embodiment includes sapphire ($Al_2O_3$), the growth substrate 101 may be separated from the epitaxial structure 110 through laser lift-off (LLO).

The manufacturing method of an LED 100 according to an embodiment includes a one-time process of attaching a support substrate 121, and replacing a substrate separating the growth substrate 101. As such, a process of replacing a substrate that is performed under a high temperature and high pressure is minimized in the manufacturing method of an LED 100 according to an embodiment, thereby minimizing problems that occur due to contraction and expansion, etc., in a process of replacing a substrate.

Figure 6:
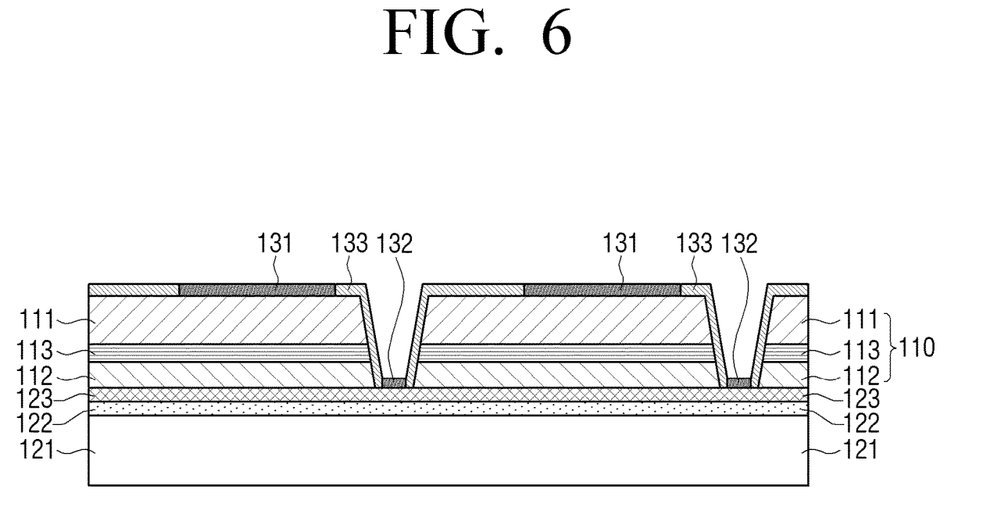
FIG. 6 is a cross-sectional view illustrating a process of forming electrodes of an LED according to an embodiment.

FIG. 6 is a cross-sectional view illustrating a process of forming electrodes 131, 132 of an LED 100 according to an embodiment.

Referring to FIG. 6, the epitaxial structure 110 is etched such that a portion of the second semiconductor layer 112 is exposed, and then a first electrode 131 is formed on the exposed second semiconductor layer 112. Likewise, the epitaxial structure 110 is etched such that a portion of the first semiconductor layer 111 is exposed, and then a second electrode 132 is formed on the exposed first semiconductor layer 111.

In the epitaxial structure 110 according to an embodiment, the second semiconductor layer 112 on which a p-type dopant is doped (e.g., doped with a p-type dopant) is formed to be more adjacent to the support substrate 121 than the first semiconductor layer 111 on which an n-type dopant is doped. Accordingly, the first electrode 131 is formed to be more adjacent to the support substrate 121 than the second electrode 132.

Figure 7:
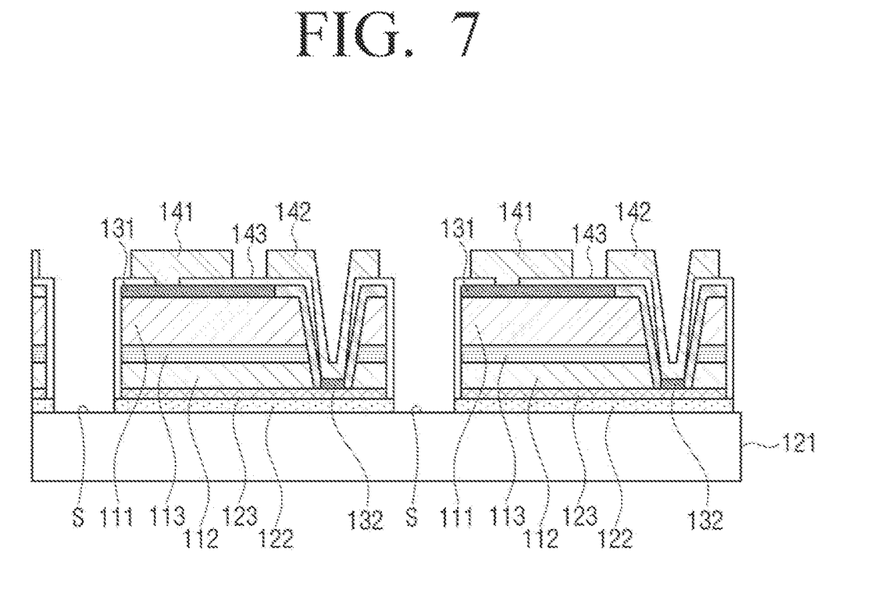
FIG. 7 is a cross-sectional view illustrating processes of forming electrode pads and removing a predetermined area of an epitaxial structure of an LED according to an embodiment.

FIG. 7 is a cross-sectional view illustrating processes of forming electrode pads 141, 142 and removing a predetermined area of an epitaxial structure of an LED 100 according to an embodiment.

Referring to FIG. 7, a first electrode pad 141 electronically connected with the first electrode 131 and a second electrode pad 142 electronically connected with the second electrode 132 may be formed, and a predetermined area of the epitaxial structure 110 may be removed.

The first electrode pad 141 and the second electrode pad 142 are extensively formed such that they are arranged on the first semiconductor layer 111. Also, the first electrode pad 141 and the second electrode pad 142 are located on the same plane, and are formed in a flip chip structure.

In addition, the first electrode pad 141 and the second electrode pad 142 may be provided as patterned metal patterns. As the second electrode 132 is formed to be more adjacent to the first semiconductor layer 111 than the first electrode 131, the height of the second electrode pad 142 may be formed to be lower than the height of the first electrode pad 141. Also, the first electrode pad 141 may be extensively formed in a vertical direction of the epitaxial structure 110.

As a predetermined area of the epitaxial structure 110 is removed, a separated LED 100 may be formed. Specifically, for forming a separated LED 100, predetermined areas of the first semiconductor layer 111, the active layer 113, and the second semiconductor layer 112 of the epitaxial structure 110 are removed, and a portion S of the support substrate 121 is exposed. In the exposed area S of the support substrate 121, the LED 100 is separated from the first semiconductor layer 111, the active layer 113, and the second semiconductor layer 112, and is formed as a single LED 100.

The LED 100 is formed by processing the epitaxial structure 110 after the epitaxial structure 110 is attached to the support substrate 121 and the growth substrate 101 is separated. Thus, the problem that the LED 100 is warped by heat and pressure provided in the process of attaching the support substrate 121 and separating the growth substrate 101 can be prevented.

Also, even if warpage occurs in the epitaxial structure 110 in an operation of replacing a substrate, there is no influence on the LED 100 formed after the operation of replacing a substrate, and there is also no influence on pitches among the LEDs 100 formed after the operation of replacing a substrate.

FIG. 8 is a cross-sectional view illustrating a process in which an LED 100 is separated from a support substrate 121 according to an embodiment.

Referring to FIG. 8, the manufacturing process of an LED according to an embodiment may further include an operation of, after forming the LED 100, separating the LED 100 from the support substrate 121 for mounting the LED 100 on the device substrate 10.

The support substrate 121 may be separated from the LED 100 through laser lift-off (LLO) of irradiating a laser beam L on the back surface 121b of the support substrate 121.

A pick up apparatus 11 is of a laser type, and the support substrate 121 may perform the function of a carrier substrate.

Specifically, the support substrate 121 may contact a plurality of LEDs 100, and fix the plurality of LEDs 100 to the support substrate 121. That is, on the first surface 121a of the support substrate 121, the LEDs 100 may be attached.

Afterwards, a laser beam L irradiated on the second surface 121b of the support substrate 121 through a mask plate 12 may separate the LEDs 100 and arrange them on the device substrate 10.

Here, the irradiated laser beam L is of a wavelength that is absorbed only in the separation layer 122 that will be described below, and may be irradiated on the separation layer 122 between the LED 100s and the support substrate 121. Also, the laser beam L may include energy that can completely remove the separation layer 122 between the LEDs 100 and the support substrate 121 by evaporation.

As the separation layer 122 attached to each separated LED 100 is removed by a laser beam L irradiated on the support substrate 121, the LEDs 100 may be separated and arranged on the device substrate 10.

That is, the plurality of LEDs 100 supported by the support substrate 121 may be mounted on the device substrate 10 by a laser method.

As illustrated in FIG. 1, by a laser lift-off method, the LED 100 from which the separation layer 122 was removed may be attached to the device substrate 10. Such an LED 100 is of a flip chip structure, and when the LED 100 is attached to the device substrate 10, the LED 100 may be welded as it is by using the electrode pads 141, 142 on the lower surface of the LED 100 without using an additional connecting structure like a metal lead (wire) or an intermediate medium like a ball grid array (BGA).

Such an LED 100 of a flip chip type is a structure that is advantageous for miniaturization, reducing weight, and increasing integration of a diode, and also can improve light emitting efficiency and efficiency of a transfer process, etc., in manufacturing a display apparatus.

Figure 9:
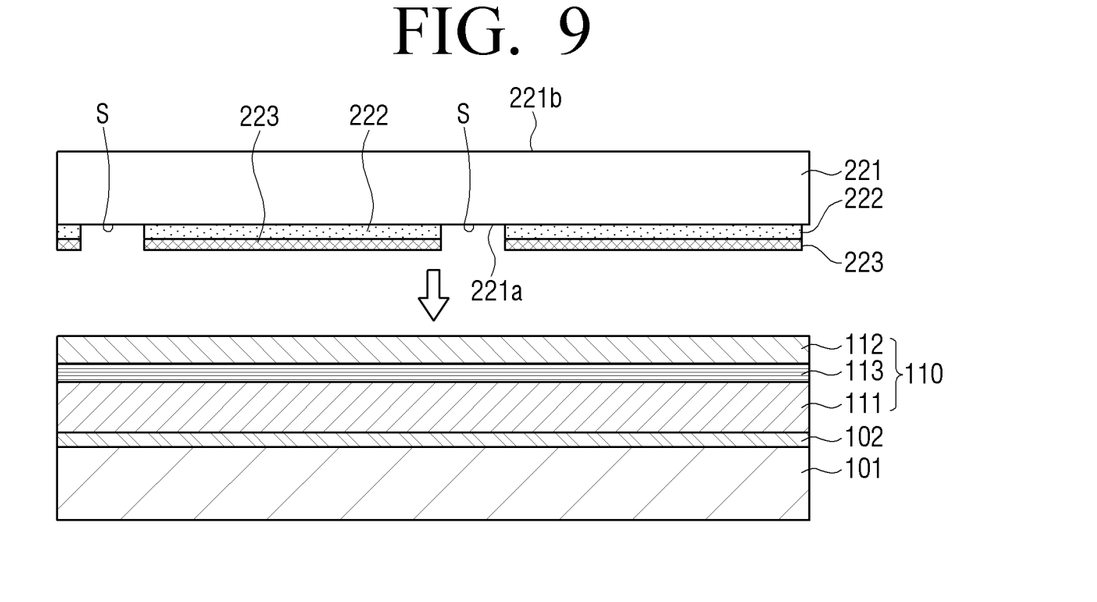
FIG. 9 is a cross-sectional view illustrating a process of attaching a support substrate of an LED according to another embodiment.

FIG. 9 is a cross-sectional view illustrating a process of attaching a support substrate 221 of an LED 100 according to another embodiment.

The manufacturing method of an LED 100 according to another embodiment may include an operation of growing an epitaxial structure 110 on a growth substrate 101, an operation of attaching a support substrate 221 to the epitaxial structure 110, an operation of separating the growth substrate 101, an operation of forming an electrode on the epitaxial structure 110, and an operation of forming an electrode pad, and forming an LED 100 separated through isolation.

Here, the manufacturing method of an LED 100 according to another embodiment is different from the embodiments described with reference to FIGS. 2 to 8 in that the support substrate 221 attached to the epitaxial structure 110 includes a separation layer 222 and a transparent electrode layer 223 from which predetermined areas S were removed. Hereinafter, a manufacturing process of the support substrate 221 will be described in detail, focusing on differences as compared to manufacturing process described with reference to FIGS. 2 to 8.

Referring to FIG. 9, the support substrate 221 of the LED according to another embodiment may include a separation layer 222 and a transparent electrode layer 223 from which predetermined areas S were removed (or not formed). The separation layer 222 and the transparent electrode layer 223 may be formed only in areas corresponding to the LED 100.

Also, the support substrate 221 may include a first surface 221a attached to the epitaxial structure 110 and a second surface 221b opposite to the first surface 221a.

On the first surface 221a of the support substrate 221, the separation layer 222 and the transparent electrode layer 223 may be sequentially arranged. The arranged separation layer 222 and transparent electrode layer 223 may be etched to correspond to the LED 100.

In addition, a portion of the support substrate 221 may be made to be exposed by removing predetermined areas of the separation layer 222 and the transparent electrode layer 223.

As the predetermined areas S of the separation layer 222 and the transparent electrode layer 223 of the support substrate 221 attached to the epitaxial structure 110 are removed in advance, in the step of removing a predetermined area S of the epitaxial structure 110 after attaching the support substrate 221 to the epitaxial structure 110, the predetermined areas S of the separation layer 222 and the transparent electrode layer 223 may not be removed.

The separation layer 222 is for allowing or facilitating easy separation of the LED 100 from the support substrate 221, and preventing influence exerted on an adjacent LED 100 when the LED is mounted on the device substrate 10. Accordingly, the separation layer 222 may be formed only in an area corresponding to the LED 100.

The transparent electrode layer 223 may be arranged under the separation layer 222, and as the support substrate 221 is attached to the epitaxial structure 110, the transparent electrode layer 223 may be located to be adjacent to the surface of the second semiconductor layer 112. Accordingly, a predetermined area S of the transparent electrode layer 223 may be removed in advance such that the transparent electrode layer 223 is formed only in the area of the second semiconductor layer 112 forming the LED 100.

When the support substrate 221 including the separation layer 222 and the transparent electrode layer 223 are attached to the epitaxial structure 110, the epitaxial structure 110, the transparent electrode layer 223, the separation layer 222, and the support substrate 221 are sequentially laminated from the growth substrate 101. Here, predetermined areas S of the transparent electrode layer 223 and the separation layer 222 are removed, and the layers may be attached to the epitaxial structure 110 in a state of being formed only in areas corresponding to the LED 100.

Also, as the separation layer 222 and the transparent electrode layer 223 from which predetermined areas S were removed are formed on the support substrate 221, the manufacturing process of the LED 100 can become more simplified.

Figure 10:
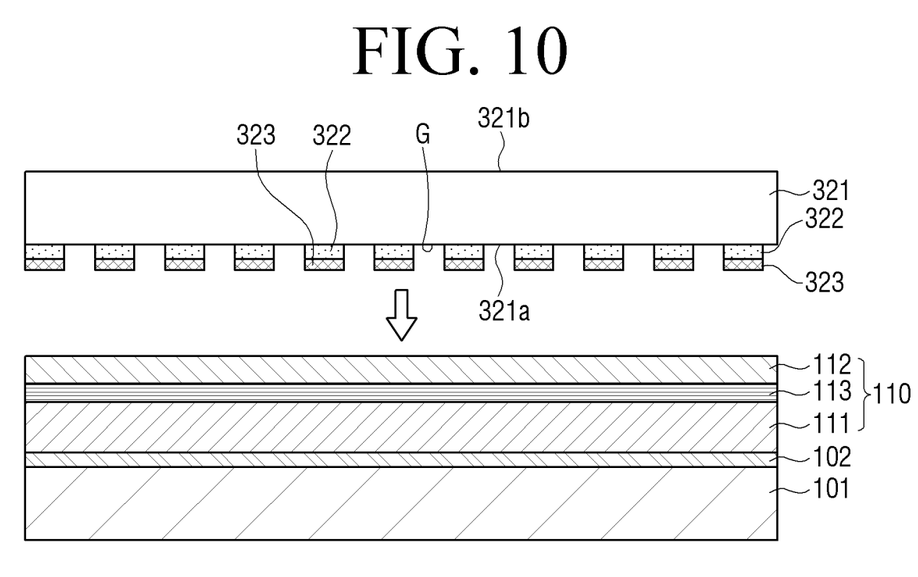
FIG. 10 is a cross-sectional view illustrating a process of attaching a support substrate of an LED according to still another embodiment.

FIG. 10 is a cross-sectional view illustrating a process of attaching a support substrate 321 of an LED 100 according to still another embodiment.

Here, the manufacturing method of an LED 100 according to still another embodiment is different from the support substrate 221 according to the embodiment described in FIG. 9 in that the support substrate 321 attached to the epitaxial structure 110 includes a separation layer 322 and a transparent electrode layer 323 of which some areas G were removed so as to have a smaller size than the LED 100. Hereinafter, a manufacturing process of the support substrate 321 will be described in detail, focusing on differences as compared to manufacturing process described with reference to FIG. 9.

Referring to FIG. 10, the support substrate 321 of the LED according to another embodiment includes a separation layer 322 and a transparent electrode layer 323. The separation layer 322 and the transparent electrode layer 323 may be patterned to have smaller areas than the separated LED 100.

On the first surface 321a of the support substrate 321, the separation layer 322 and the transparent electrode layer 323 are arranged sequentially. Then, the arranged separation layer 322 and transparent electrode layer 323 are patterned to smaller sizes than the LED 100.

In addition, some areas G of the separation layer 322 and the transparent electrode layer 323 may be removed, and a portion of the support substrate 321 may thereby be exposed.

As the separation layer 322 is formed in a smaller size than the LED 100, the LED 100 can be easily separated from the support substrate 321 when the LED 100 is mounted on the device substrate 10.

Further, as the separation layer 322 and the transparent electrode layer 323 from which some areas G were removed are formed on the support substrate 321, the process of mounting the LED 100 on the device substrate 10 can be simplified.

The above description has been provided with reference to embodiments. However, the terms used herein are just for explanation, and are not intended to be interpreted as restrictive meaning. Also, according to the descriptions so far, various amendments and modifications of embodiments may be made. Accordingly, unless there is any explicit disclaimer, the disclosure may be implemented freely within the scope of the appended claims.

What is claimed is:

1. A light emitting diode (LED) comprising:
a device substrate;
a first semiconductor layer above the device substrate, and doped with an n-type dopant;
a second semiconductor layer above the first semiconductor layer, and doped with a p-type dopant;
an active layer between the first semiconductor layer and the second semiconductor layer and configured to provide light;
a transparent electrode layer adjacent to an upper part of the second semiconductor layer; and
a first electrode pad and a second electrode pad between the device substrate and the first semiconductor layer, the first electrode pad electronically connected with a first electrode formed on the first semiconductor layer and the second electrode pad electrically connected with a second electrode formed on the second semiconductor layer and contacting the transparent electrode layer,
wherein light provided by the active layer is irradiated to an outside in a direction from the active layer to the second semiconductor layer.

2. The LED of claim 1, wherein:
the n-type dopant is at least one of Si, Ge, Se, Te, and C; and
the p-type dopant is at least one of Mg, Zn, Be, Ca, Sr, and Ba.

3. The LED of claim 1, further comprising:
a reflective layer below the first semiconductor layer,
wherein the reflective layer reflects light provided by the active layer in the direction from the active layer to the second semiconductor layer.

4. A light emitting diode (LED) comprising:
a support substrate;
a second semiconductor layer above the support substrate, and doped with a p-type dopant;
a first semiconductor layer above the second semiconductor layer, and doped with an n-type dopant;
an active layer between the first semiconductor layer and the second semiconductor layer and configured to provide light;
a first electrode pad and a second electrode pad above the first semiconductor layer, the first electrode pad electronically connected with a first electrode formed on the first semiconductor layer and the second electrode pad electrically connected with a second electrode formed on the second semiconductor layer;
a transparent electrode layer below the second semiconductor layer and contacting the second electrode; and
a separation layer between the support substrate and the transparent electrode layer.

5. The LED of claim 4, wherein the support substrate is a gallium arsenide substrate, a sapphire substrate, a silicon substrate, or a plastic substrate.

6. The LED of claim 4, wherein the transparent electrode layer and the separation layer are arranged to correspond to the second semiconductor layer such that a portion of the support substrate is exposed.

7. A manufacturing method of an LED, the manufacturing method comprising:
forming, on a growth substrate, an epitaxial structure comprising a first semiconductor layer, an active layer, and a second semiconductor layer;
attaching a support substrate to the epitaxial structure;
separating the growth substrate from the epitaxial structure to which the support substrate is attached;
forming a first electrode and a second electrode on the epitaxial structure from which the growth substrate was separated;
forming a first electrode pad electrically connected with the first electrode and forming a second electrode pad electrically connected with the second electrode; and
removing a predetermined area of the epitaxial structure,
wherein the manufacturing method further comprises, after the removing the predetermined area, separating the LED from the support substrate.

8. The manufacturing method of claim 7, further comprising:
prior to the attaching the support substrate, forming a separation layer and a transparent electrode layer on the support substrate,
wherein the attaching the support substrate comprises attaching the support substrate such that the separation layer and the transparent electrode layer are between the support substrate and the epitaxial structure.

9. The manufacturing method of claim 7, wherein the first electrode pad and the second electrode pad are formed below the first semiconductor layer.

10. The manufacturing method of claim 7, wherein the separating the growth substrate comprises:
separating the growth substrate by a laser lift off method or a chemical lift off method.

11. The manufacturing method of claim 7, wherein the growth substrate is a gallium arsenide substrate or a sapphire substrate.

12. The manufacturing method of claim 7, further comprising:
mounting the separated LED on a device substrate.

13. The manufacturing method of claim 7, wherein the forming the epitaxial structure comprises:
forming the epitaxial structure above a buffer layer on the growth substrate.

14. The manufacturing method of claim 8, wherein the transparent electrode layer, the separation layer, and the support substrate are sequentially arranged on the second semiconductor layer.

15. The manufacturing method of claim 8, wherein the forming the separation layer and the transparent electrode layer comprises:
removing predetermined areas of the separation layer and the transparent electrode layer.

16. The manufacturing method of claim 8, further comprising:
after removing the predetermined area of the epitaxial structure, separating the LED from the support substrate by irradiating a laser beam on the separation layer between the support substrate and the second semiconductor layer to remove the separation layer.

17. The manufacturing method of claim 8, wherein prior to the attaching, the separation layer and the transparent electrode layer are on a first surface of the support substrate only in areas corresponding to LEDs, such that predetermined areas of the first surface are exposed.

18. The manufacturing method of claim 17, wherein the areas of the first surface on which the separation layer and the transparent electrode layer are provided are smaller in size than the LEDs.

* * * * *